(12) United States Patent
Murayama et al.

(10) Patent No.: US 12,409,667 B2
(45) Date of Patent: Sep. 9, 2025

(54) ACTIVE ENERGY IRRADIATION DEVICE AND ACTIVE ENERGY IRRADIATION SYSTEM

(71) Applicant: HAMAMATSU PHOTONICS K.K., Hamamatsu (JP)

(72) Inventors: Kyoichi Murayama, Hamamatsu (JP); Keita Umeno, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 179 days.

(21) Appl. No.: 18/268,647

(22) PCT Filed: May 26, 2021

(86) PCT No.: PCT/JP2021/020019
§ 371 (c)(1),
(2) Date: Jun. 21, 2023

(87) PCT Pub. No.: WO2022/137594
PCT Pub. Date: Jun. 30, 2022

(65) Prior Publication Data
US 2024/0034074 A1    Feb. 1, 2024

(30) Foreign Application Priority Data

Dec. 24, 2020  (JP) ................................ 2020-215357

(51) Int. Cl.
*B41J 11/00*    (2006.01)
*B41J 29/377*   (2006.01)
*H05K 7/20*     (2006.01)

(52) U.S. Cl.
CPC .... *B41J 11/00214* (2021.01); *B41J 11/00218* (2021.01); *B41J 29/377* (2013.01); *H05K 7/20* (2013.01)

(58) Field of Classification Search
CPC ............ B41J 11/00214; B41J 11/00218; B41J 29/377; B41J 2/01; H05K 7/20
See application file for complete search history.

(56) References Cited

U.S. PATENT DOCUMENTS

2013/0182436 A1*  7/2013  Payne ................... F21V 29/677
                                                    362/249.01

FOREIGN PATENT DOCUMENTS

JP      H10-023618 A    1/1998
JP      2014-210430 A   11/2014
(Continued)

OTHER PUBLICATIONS

International Preliminary Report on Patentability mailed Jul. 6, 2023 for PCT/JP2021/020019.

*Primary Examiner* — Bradley W Thies
(74) *Attorney, Agent, or Firm* — Faegre Drinker Biddle & Reath LLP

(57) ABSTRACT

An active energy irradiation device includes: a plurality of active energy irradiation units; an air-cooled heatsink thermally connected to the active energy irradiation units; a housing that houses the active energy irradiation units and the heatsink; an intake unit that introduces air into the housing; an exhaust unit that discharges the air to an outside of the housing; and a duct provided between the heatsink and the exhaust unit inside the housing, and allowing the air, which has passed through the heatsink, to flow through to the exhaust unit. An air presence region where the air exists before passing through the heatsink is provided around the duct inside the housing so as to surround the duct.

10 Claims, 13 Drawing Sheets

(56) References Cited

FOREIGN PATENT DOCUMENTS

| | | |
|---|---|---|
| JP | 3196411 U | 3/2015 |
| JP | 2015-184537 A | 10/2015 |
| JP | 2016-202190 A | 12/2016 |
| JP | 2017-098443 A | 6/2017 |
| JP | 2018-140342 A | 9/2018 |
| JP | 2019-057471 A | 4/2019 |
| WO | WO-2013/130861 A1 | 9/2013 |

* cited by examiner

Fig.11
(a)
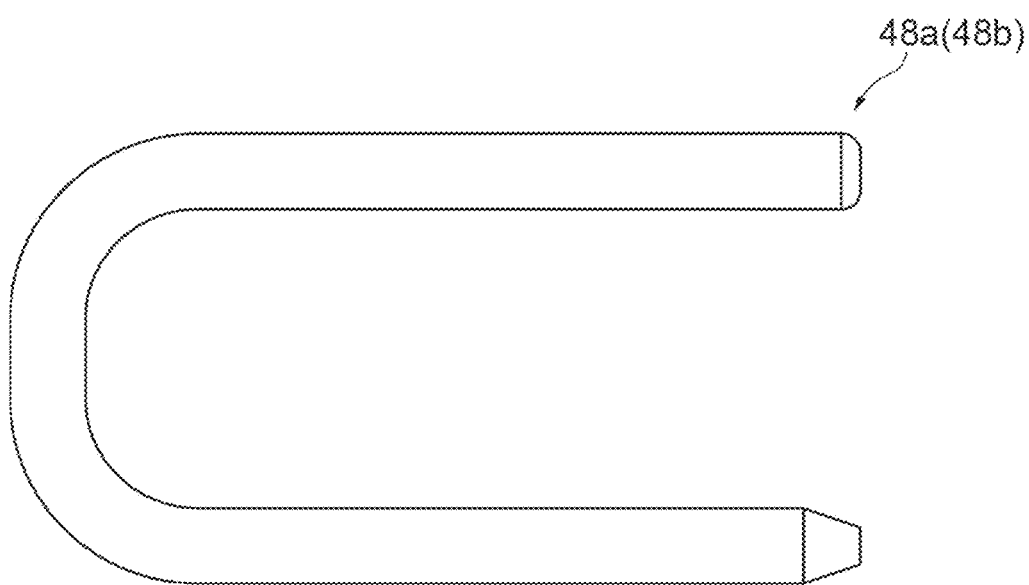
48a(48b)
(b)
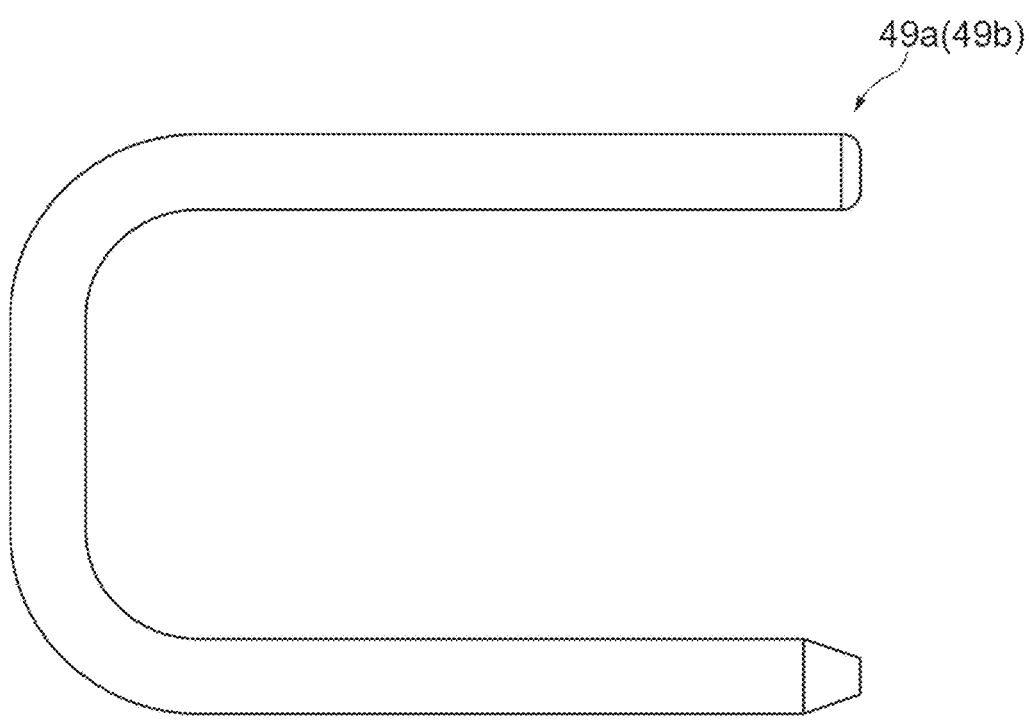
49a(49b)

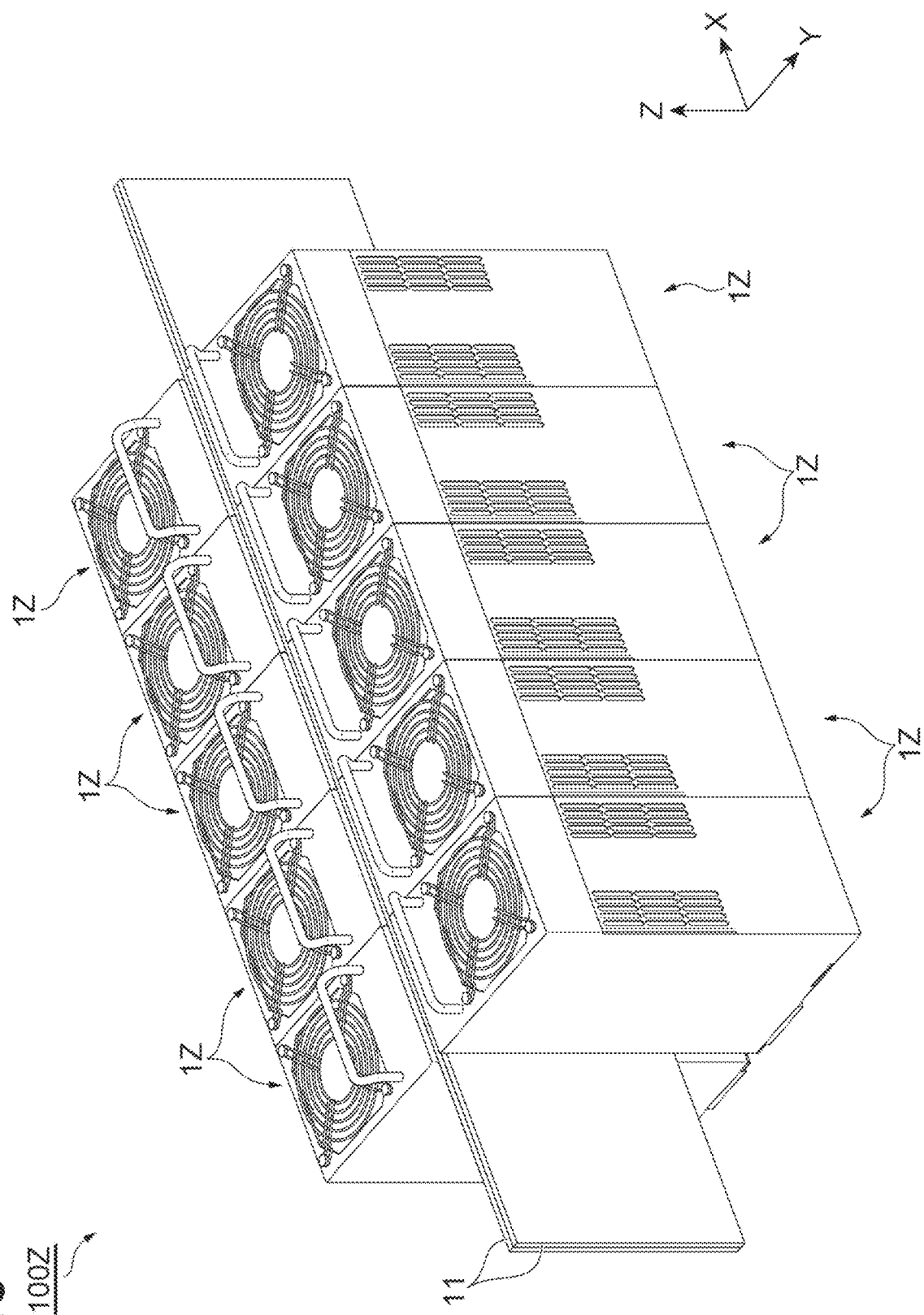

ACTIVE ENERGY IRRADIATION DEVICE AND ACTIVE ENERGY IRRADIATION SYSTEM

TECHNICAL FIELD

The present disclosure relates to an active energy irradiation device and an active energy irradiation system.

BACKGROUND ART

An active energy irradiation device has been known that includes a plurality of active energy irradiation units; an air-cooled heatsink thermally connected to the active energy irradiation units; and a housing that houses the active energy irradiation units and the heatsink (for example, refer to Patent Literature 1).

CITATION LIST

Patent Literature

Patent Literature 1: Japanese Utility Model Registration No. 3196411

SUMMARY OF INVENTION

Technical Problem

In the active energy irradiation device as described above, the housing becomes overheated due to heat of air that has passed through the heatsink, which is a concern.

An object of the present disclosure is to provide an active energy irradiation device and an active energy irradiation system capable of suppressing the overheating of a housing.

Solution to Problem

According to one aspect of the present disclosure, there is provided an active energy irradiation device including: a plurality of active energy irradiation units arranged at least along a predetermined direction; an air-cooled heatsink thermally connected to the active energy irradiation units; a housing that houses the active energy irradiation units and the heatsink; an intake unit that is provided in the housing, and that introduces air into the housing; an exhaust unit that is provided in the housing, and that discharges the air to an outside of the housing; and a duct provided between the heatsink and the exhaust unit inside the housing, and allowing the air, which has passed through the heatsink, to flow through to the exhaust unit. An air presence region where the air exists before passing through the heatsink is provided around at least a part of the duct inside the housing so as to surround the duct.

In this active energy irradiation device, due to the presence of the air presence region, at least the part of the duct can be prevented from coming into direct contact with the housing, and the propagation of heat from the air, which passes through the heatsink and flows through the duct, to the housing can be suppressed. Therefore, the overheating of the housing can be suppressed.

In the active energy irradiation device according to one aspect of the present disclosure, at least the part of the duct may have a polygonal pipe shape, and all outer surfaces of at least the part of the duct may be in contact with the air presence region. In this case, at least the part of the duct can be reliably prevented from coming into direct contact with the housing.

In the active energy irradiation device according to one aspect of the present disclosure, the air presence region may include a space defined by inner surfaces of the housing and outer surfaces of the duct, and the intake unit may introduce the air into the space. In this case, the air presence region can be constituted by the low-temperature space to which the air is introduced from outside.

In the active energy irradiation device according to one aspect of the present disclosure, the duct may include a linear portion extending with a constant cross-sectional area, and an enlarged portion provided on a downstream side of the linear portion and extending such that a cross-sectional area increases as the enlarged portion extends downstream. The space into which the air is introduced by the intake unit may be defined by the inner surfaces of the housing, outer surfaces of the linear portion, and outer surfaces of the enlarged portion. In this case, the space into which the air is introduced from outside can be specifically defined.

In the active energy irradiation device according to one aspect of the present disclosure, the air presence region may include a filter unit of the intake unit. In this case, the air presence region can be constituted by the low-temperature filter unit of the intake unit.

In the active energy irradiation device according to one aspect of the present disclosure, end portion on a heatsink side of the duct may be inserted into grooves formed in heat radiation fins of the heatsink. In this case, the need for a seal member such as a packing at a connection between the duct and the heat radiation fins can be eliminated.

In the active energy irradiation device according to one aspect of the present disclosure, the intake unit may include an intake port that is open along a direction intersecting a direction from the heatsink toward the exhaust unit, and that communicates with an inside of the housing. Accordingly, the air can be introduced from outside into the housing along a direction intersecting an exhaust direction from the heatsink toward the exhaust unit.

In the active energy irradiation device according to one aspect of the present disclosure, the active energy irradiation units may perform irradiation with an ultraviolet ray or an electron beam. Accordingly, the active energy irradiation device can be used as a device that performs irradiation with an ultraviolet ray or an electron beam.

According to one aspect of the present disclosure, there is provided an active energy irradiation system including: a plurality of the active energy irradiation devices. The plurality of active energy irradiation devices are arranged to be in contact with each other in the predetermined direction.

Since the active energy irradiation system includes the active energy irradiation devices, the effect of suppressing the overheating of the housing is accomplished. In addition, since the plurality of active energy irradiation devices are arranged to be in contact with each other in the predetermined direction, the housing is likely to become overheated (particularly, both end portions in the predetermined direction are likely to become overheated), so that the effect of suppressing the overheating of the housing becomes particularly effective.

Advantageous Effects of Invention

According to the present disclosure, it is possible to provide the active energy irradiation device and the active energy irradiation system capable of suppressing the overheating of the housing.

BRIEF DESCRIPTION OF DRAWINGS

FIG. 11(*a*) is a front view of a first heat pipe of the heatsink illustrated in FIG. 4. FIG. 11(*b*) is a front view of a second heat pipe of the heatsink illustrated in FIG. 4.

FIG. 13 is a perspective view of an active energy irradiation system according to a modification example.

DESCRIPTION OF EMBODIMENTS

Figure 1:
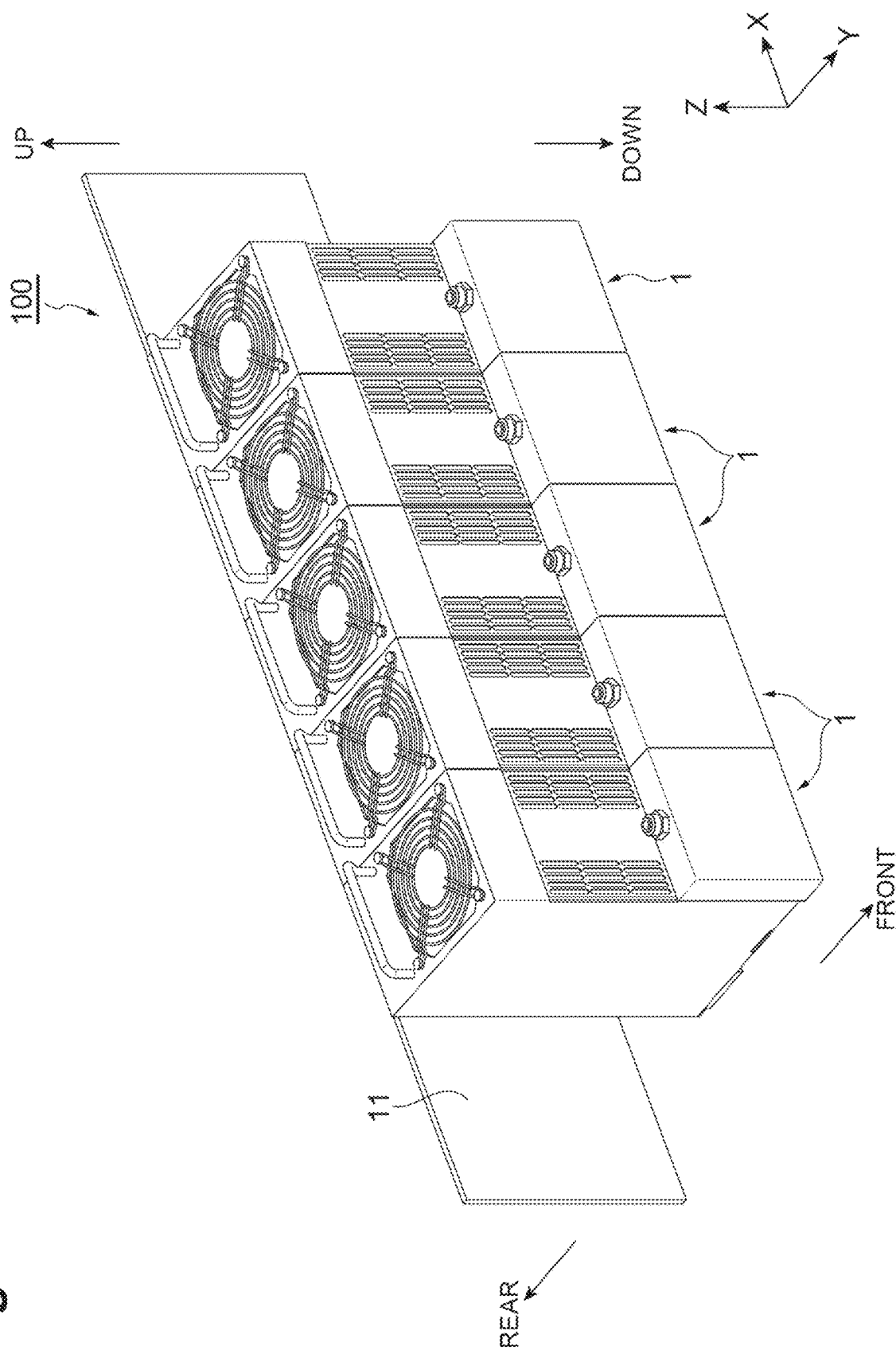
FIG. 1 is a perspective view of an active energy irradiation system according to one embodiment.
Figure 2:
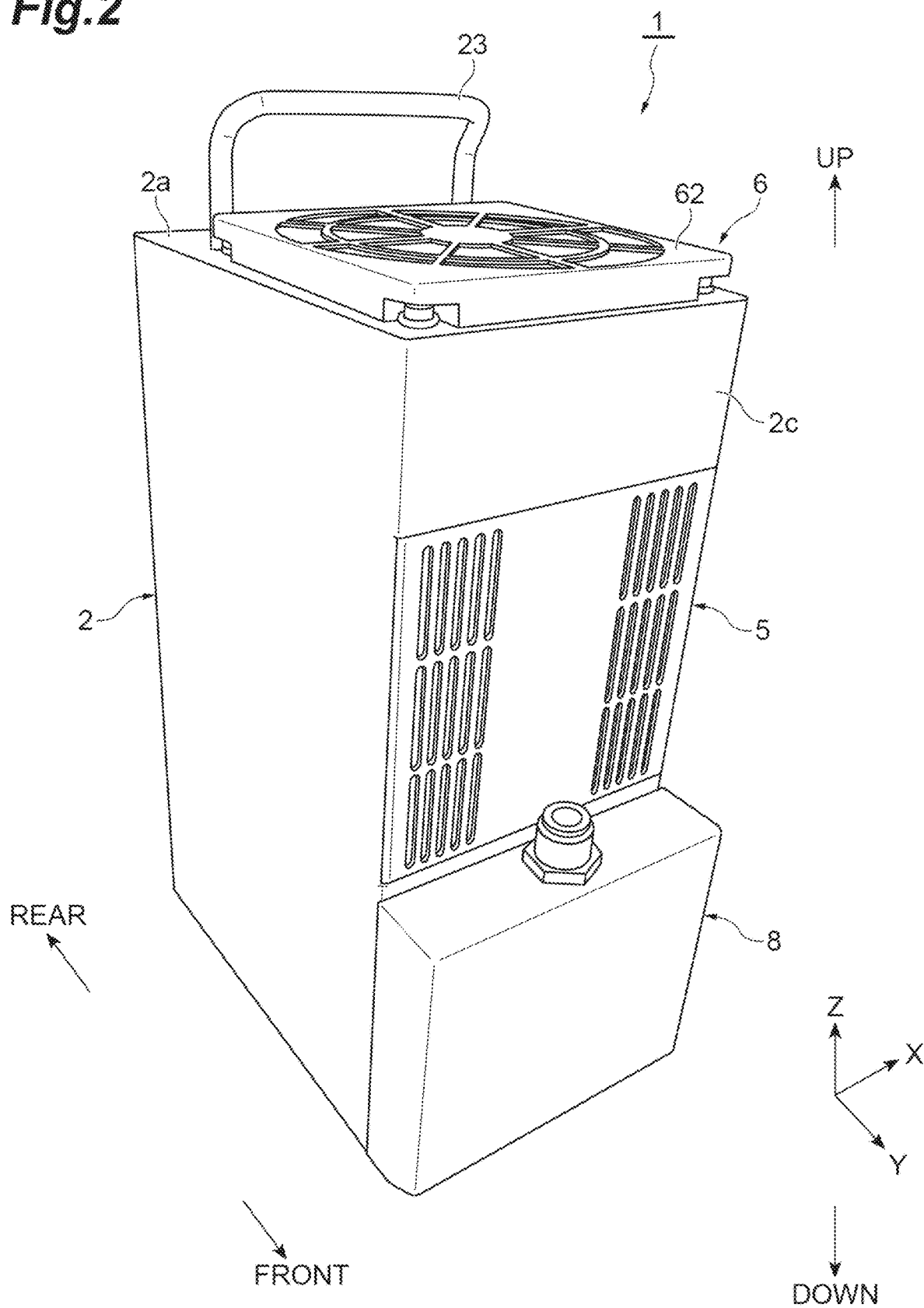
FIG. 2 is a perspective view of an active energy irradiation device illustrated in FIG. 1.
Figure 3:
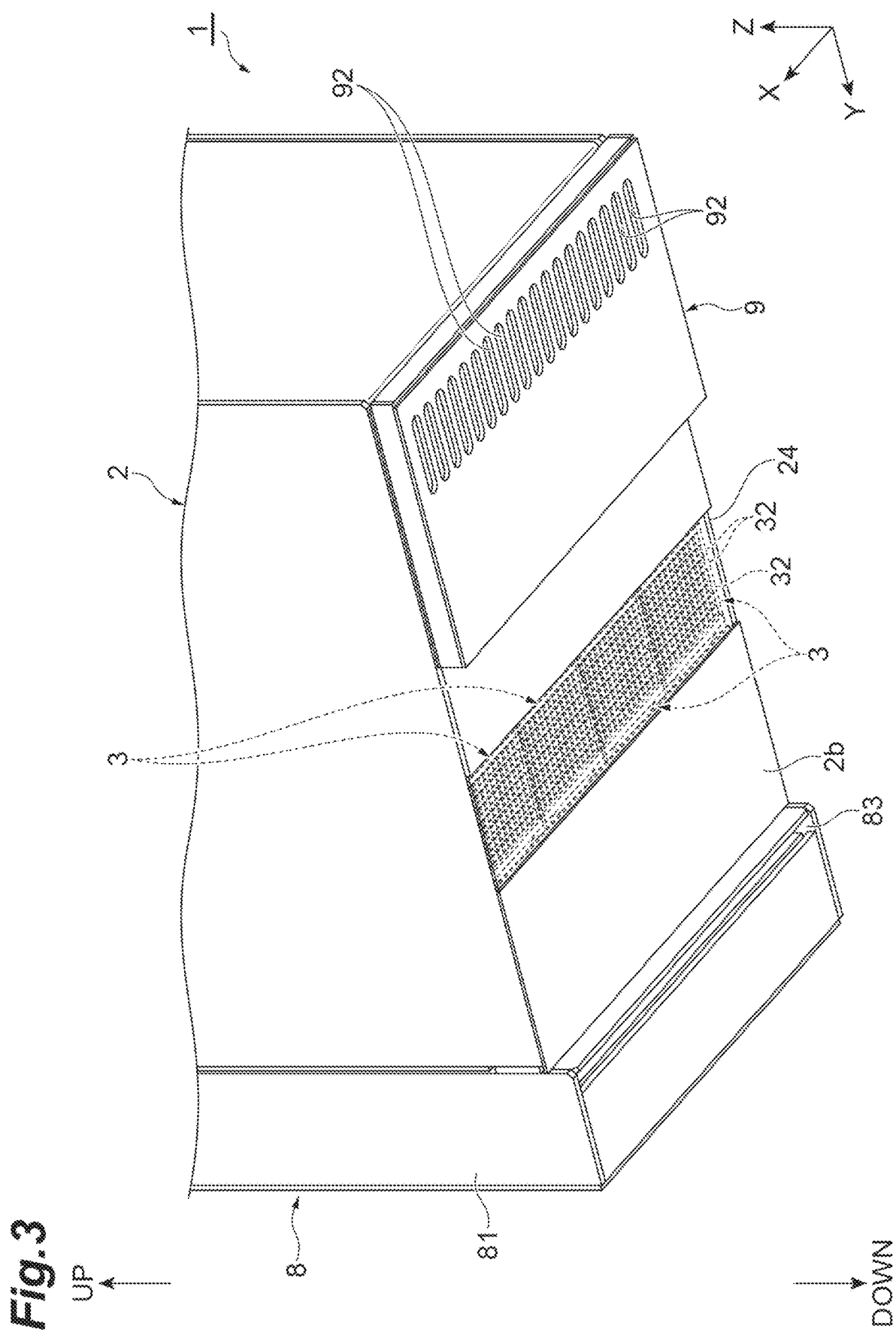
FIG. 3 is a perspective view of the active energy irradiation device illustrated in FIG. 2 when viewed from below.
Figure 4:
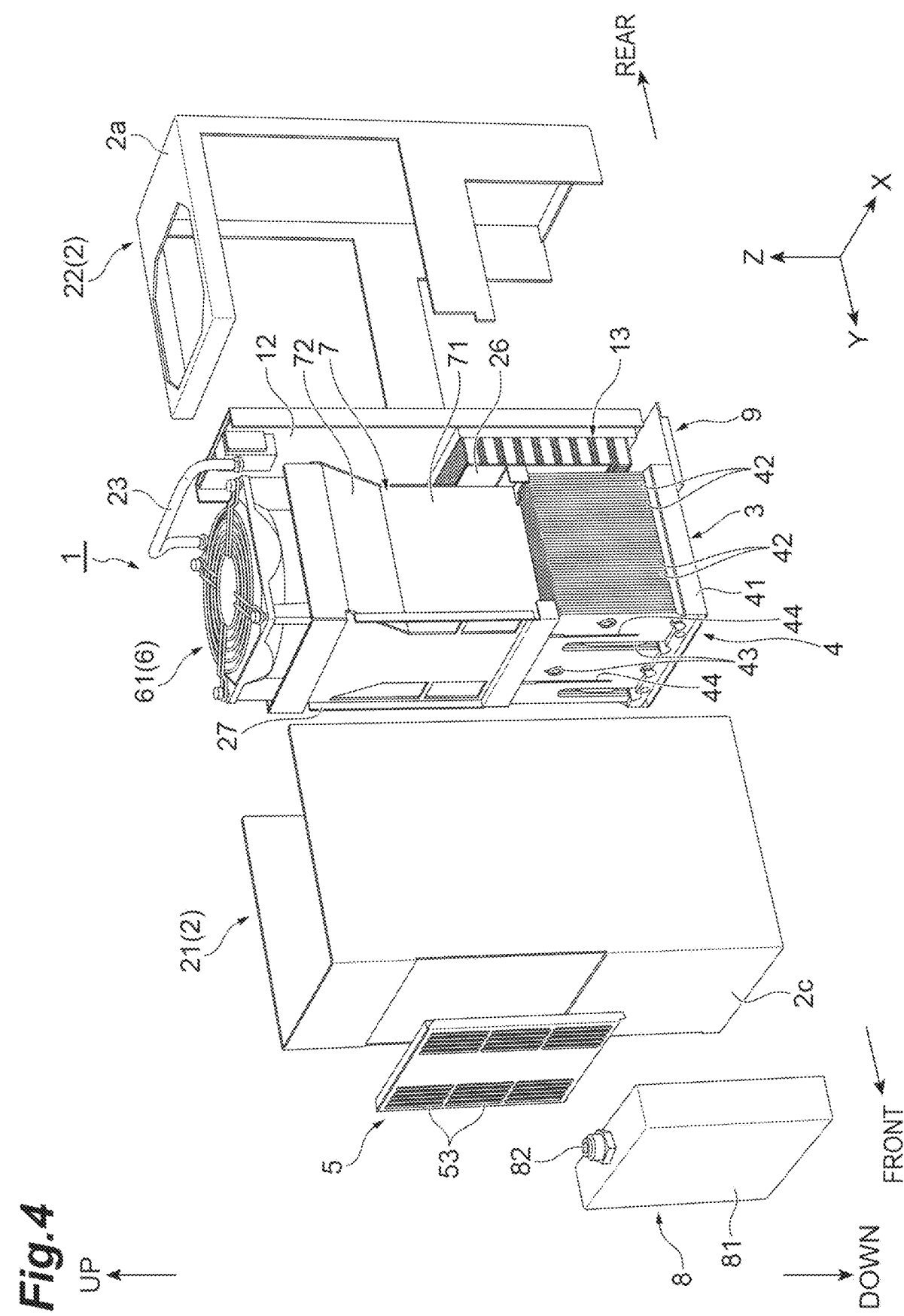
FIG. 4 is an exploded perspective view of the active energy irradiation device illustrated in FIG. 2.

Hereinafter, an embodiment of the present disclosure will be described in detail with reference to the drawings. It should be noted that in the drawings, the same or equivalent portions are denoted by the same reference signs, and duplicate descriptions will be omitted.

As illustrated in FIG. 1, an active energy irradiation system 100 is, for example, a system that is installed in an ultraviolet (UV) printer, and includes a plurality of active energy irradiation devices 1. The active energy irradiation devices 1 are, for example, high-output air-cooled LED light sources for printing applications. The active energy irradiation devices 1 irradiate an irradiation target with light (ultraviolet rays, active energy rays) to dry ink on the irradiation target. Examples of the irradiation target include a printed matter to which a photocurable ink is adhered.

The active energy irradiation devices 1 have a rectangular parallelepiped outer shape. The active energy irradiation devices 1 are arranged to be in contact with each other in a predetermined direction. The plurality of active energy irradiation devices 1 arranged in the predetermined direction are fixed and held by a fixing plate 11. As illustrated in FIGS. 2, 3, 4, and 5, the active energy irradiation device 1 includes a housing 2, a plurality of LED substrates 3, a heatsink 4, an intake unit 5, an exhaust unit 6, a duct 7, an inert gas supply unit 8, and an inert gas suction unit 9.

Incidentally, for convenience of description, the predetermined direction in which the plurality of active energy irradiation devices 1 are arranged is defined as an "X direction", a direction perpendicular to the X direction, which is a light emission direction of the active energy irradiation devices 1, is defined as a "Z direction", and a direction orthogonal to the X direction and the Z direction is defined as a "Y direction". A side of the active energy irradiation device 1 from which light is emitted is defined as a "lower side", and the opposite side is defined as an "upper side". One side in the Y direction is defined as a "front side", and the other side in the Y direction is defined as a "rear side".

The housing 2 has a rectangular shape that is elongated in the Z direction. The housing 2 is made of metal. The housing 2 houses the LED substrates 3, the heatsink 4, and the duct 7. The housing 2 is configured by assembling a front casing 21 and a rear casing 22 to each other. A grip portion 23 for grasping the housing 2 is provided on an upper wall 2*a* of the housing 2. A driver substrate 12 with the Y direction as a thickness direction is disposed on the rear side inside the housing 2. The driver substrate 12 is an electrical driving circuit substrate for driving the active energy irradiation device 1. A driver substrate heatsink 13 that cools transistors and the like of the driver substrate 12 is disposed on the driver substrate 12. The driver substrate heatsink 13 is thermally connected to the transistors and the like of the driver substrate 12.

The LED substrate 3 includes a substrate 31 having a rectangular plate shape and constituting a predetermined circuit (refer to FIG. 8), and LED elements (active energy irradiation units) 32 that are light-emitting elements arranged at predetermined pitches in the X direction and the Y direction on the substrate 31. The LED elements 32 emit light (ultraviolet rays) downward. The LED substrates 3 are disposed at a lower end portion inside the housing 2 with the Z direction as a thickness direction of the substrates 31. The LED substrates 3 are arranged along the X direction. Accordingly, several to several hundred LED elements 32 are arranged at least in the X direction inside the housing 2. The irradiation target moving in the Y direction is irradiated with light emitted from each of the LED elements 32 on the LED substrates 3 through a light irradiation window 24 made of a glass plate and provided on a lower wall 2*b* of the housing 2.

The heatsink 4 is a heat radiation member thermally connected to the LED elements 32 on the LED substrates 3. The heatsink 4 is an air-cooled heatsink that radiates heat through heat exchange with air. Air constitutes a heat transfer medium (coolant) for cooling the LED elements 32. The heatsink 4 includes a base plate 41, heat radiation fins 42, a heat pipe 43, and a partition plate (partition member) 44.

The base plate 41 has a rectangular plate shape. The plurality of LED substrates 3 are provided on a lower surface of the base plate 41. The lower surface of the base plate 41 is in contact with the substrates 31 of the LED substrates 3. The heat radiation fins 42 have a flat plate shape with the Y direction as a thickness direction. The heat radiation fins 42 are erected on an upper surface (surface) of the base plate 41. The heat radiation fins 42 are arranged to be stacked with gaps therebetween in the Y direction (first direction).

The heat pipe 43 is provided to be embedded in a plurality of the heat radiation fins 42. The heat pipe 43 is thermally connected to the plurality of heat radiation fins 42. The partition plate 44 is provided to intersect the plurality of heat radiation fins 42. The partition plate 44 has a flat plate shape with the X direction as a thickness direction. The partition plate 44 partitions the plurality of heat radiation fins 42 in the X direction (second direction). A pair of the partition plates 44 are provided spaced from each other in the X direction on the plurality of heat radiation fins 42. The pair of partition plates 44 partition the plurality of heat radiation fins 42 into a pair of outer portions 42x located outside in the X direction and an inner portion 42y located between the pair of outer portions.

Ends on a base plate 41 side of the partition plates 44 are spaced apart from the base plate 41. Namely, the partition plates 44 partition the plurality of heat radiation fins 42 such that more air passes through in the X direction between the plurality of heat radiation fins 42 on the lower side (base plate 41 side) than on the upper side (side opposite to the base plate 41 side). The partition plates 44 are brazed and fixed to the plurality of heat radiation fins 42. The heatsink 4 is attached to the housing 2 through a bracket 25 and a support frame 26 (refer to FIG. 7).

The intake unit 5 introduces air from outside the housing 2 into the housing 2. The intake unit 5 introduces the air into a buffer space BF to be described later inside the housing 2. The intake unit 5 is provided on a portion toward an upper side of the center of a wall portion 2c on the front side of the housing 2. The intake unit 5 includes an intake filter (filter unit) 51, a filter holding portion 52, and intake ports 53.

As illustrated in FIGS. 4, 5, 6, and 7, the intake filter 51 captures foreign matter (dust and the like) contained in the air introduced into the housing 2. The intake filter 51 is made of, for example, urethane or the like. The intake filter 51 has a rectangular plate-shaped outer shape. The intake filter 51 extends over the portion toward the upper side of the center of the wall portion 2c when viewed from the front. The filter holding portion 52 houses and holds the intake filter 51. The filter holding portion 52 includes an outer plate 52x having a rectangular plate shape with the Y direction as a thickness direction. A front surface of the outer plate 52x is located on the same plane as a front surface of the wall portion 2c of the housing 2. The filter holding portion 52 is detachably attached to the duct 7 and the support frame 27 provided on the duct 7.

The intake ports 53 are through-holes that are open along the Y direction (direction intersecting a direction from the heatsink 4 toward the exhaust unit 6), and that communicate with the inside of the housing 2. The intake ports 53 are arranged in proximity to each other in regions at both end portions in the X direction of the outer plate 52x. The intake ports 53 are through-holes having an elongated hole shape with the Z direction as a longitudinal direction. Air suctioned from the intake ports 53 is introduced into the buffer space BF inside the housing 2 through the intake filter 51 (refer to FIG. 8).

The exhaust unit 6 discharges the air from inside the housing 2 to the outside of the housing 2. The exhaust unit 6 is provided on an upper end portion of the housing 2. The exhaust unit 6 includes a fan 61. For example, an axial fan is used as the fan 61. The fan 61 delivers the air, which is suctioned from the lower side along the Z direction, to the upper side under pressure along the Z direction. The fan 61 is fixed to an upper end portion inside the housing 2. An exhaust filter 62 made of, for example, urethane or the like is attached to the upper wall 2a of the housing 2 located on a discharge side of the fan 61. Incidentally, the exhaust filter 62 is illustrated only in the FIG. 2 for the sake of convenience, and the illustration in the other drawings is omitted. For example, an external pipe for outdoor exhaust (not illustrated) is connected to the discharge side of the fan 61 of the exhaust unit 6.

The duct 7 is provided between the heatsink 4 and the exhaust unit 6 inside the housing 2. The duct 7 allows the air, which has passed through the heatsink 4, to flow through to the exhaust unit 6. The duct 7 allows an inert gas, which has passed through the heatsink 4, to flow through to the exhaust unit 6. The duct 7 has a rectangular pipe shape. The duct 7 includes a linear portion 71 extending in the Z direction with a constant cross-sectional area, and an enlarged portion 72 provided on a downstream side of the linear portion 71 and extending in the Z direction such that the cross-sectional area increases as the enlarged portion 72 extends downstream.

The buffer space BF (refer to FIG. 8) that is a space into which air is introduced from outside by the intake unit 5 is provided on one side and the other side in the X direction of the duct 7 inside the housing 2. The buffer space BF is a space defined by inner surfaces of the housing 2 and outer surfaces of the linear portion 71 and the enlarged portion 72 of the duct 7. Lower end portions of the duct 7 are inserted and fixed to grooves 47 formed in the heat radiation fins 42 of the heatsink 4. An upper end portion of the duct 7 is fixed to a suction side of the fan 61. The duct 7 is attached to the housing 2 through the support frame 27.

As illustrated in FIGS. 2, 3, 4, and 5, the inert gas supply unit 8 supplies inert gas to the outside of the housing 2. Examples of the inert gas include nitrogen. The inert gas supply unit 8 forms a region, which is dominated by the inert gas (region with low oxygen concentration), in a region including an irradiation region of light from the plurality of LED elements 32, by supplying the inert gas. The inert gas supply unit 8 is attached to a lower end portion of the wall portion 2c on the front side of the housing 2. The inert gas supply unit 8 includes a purge housing 81 having a rectangular box shape; a socket 82 provided on an upper end surface of the purge housing 81; and a spray port 83 provided at a lower end portion of the purge housing 81. In the inert gas supply unit 8, the inert gas is introduced from the socket 82 into the purge housing 81, and the inert gas is sprayed from the spray port 83.

The inert gas suction unit 9 suctions the inert gas outside the housing 2, and causes the inert gas to flow into the housing 2. The inert gas suction unit 9 is a structure attached to the housing 2. The inert gas suction unit 9 is detachably attached to a rear side of the lower wall 2b of the housing 2 by fasteners such as screws. The inert gas suction unit 9 includes a suction unit housing 91 having a rectangular box shape; a suction port 92 provided in a lower surface of the suction unit housing 91; and a recovery flow path 93 provided inside the suction unit housing 91 (refer to FIG. 7). In the inert gas suction unit 9, the inert gas is suctioned into the suction unit housing 91 through the suction port 92, and the inert gas is allowed to flow through into the housing 2 by the recovery flow path 93.

Figure 6:
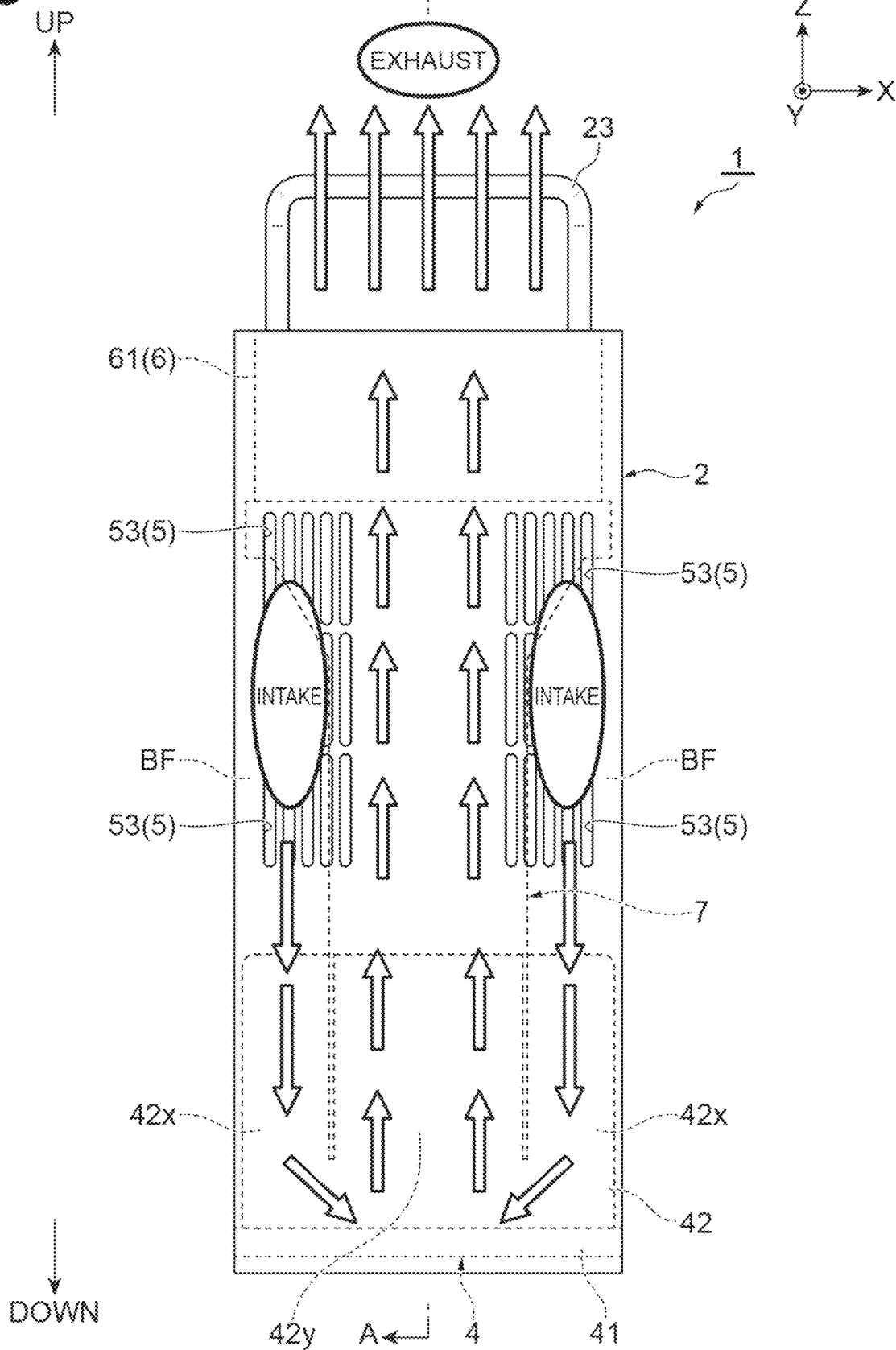
FIG. 6 is a front view illustrating the flows of air in the active energy irradiation device illustrated in FIG. 2.
Figure 7:
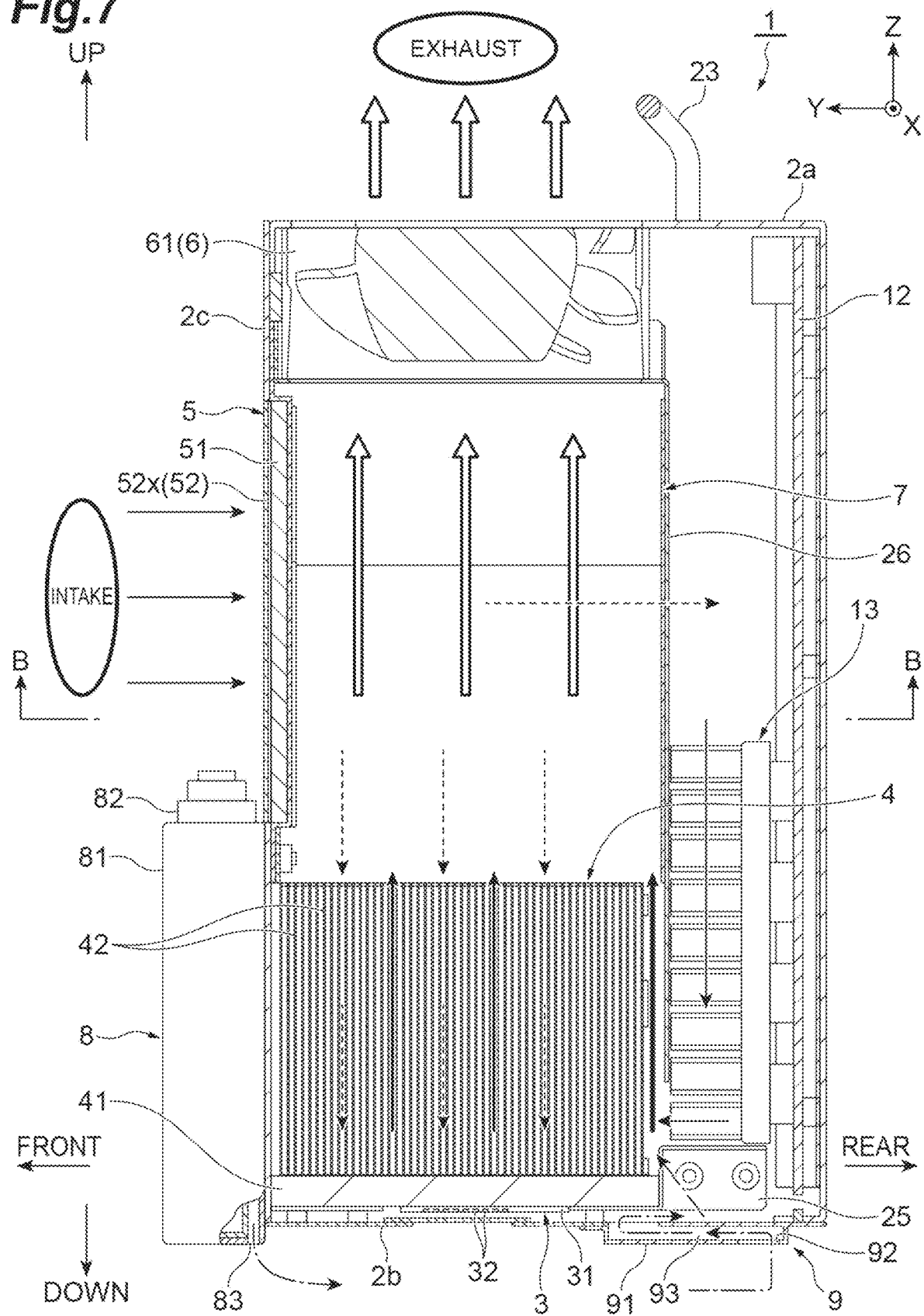
FIG. 7 is a cross-sectional view of the active energy irradiation device taken along line A-A illustrated in FIG. 6.
Figure 8:
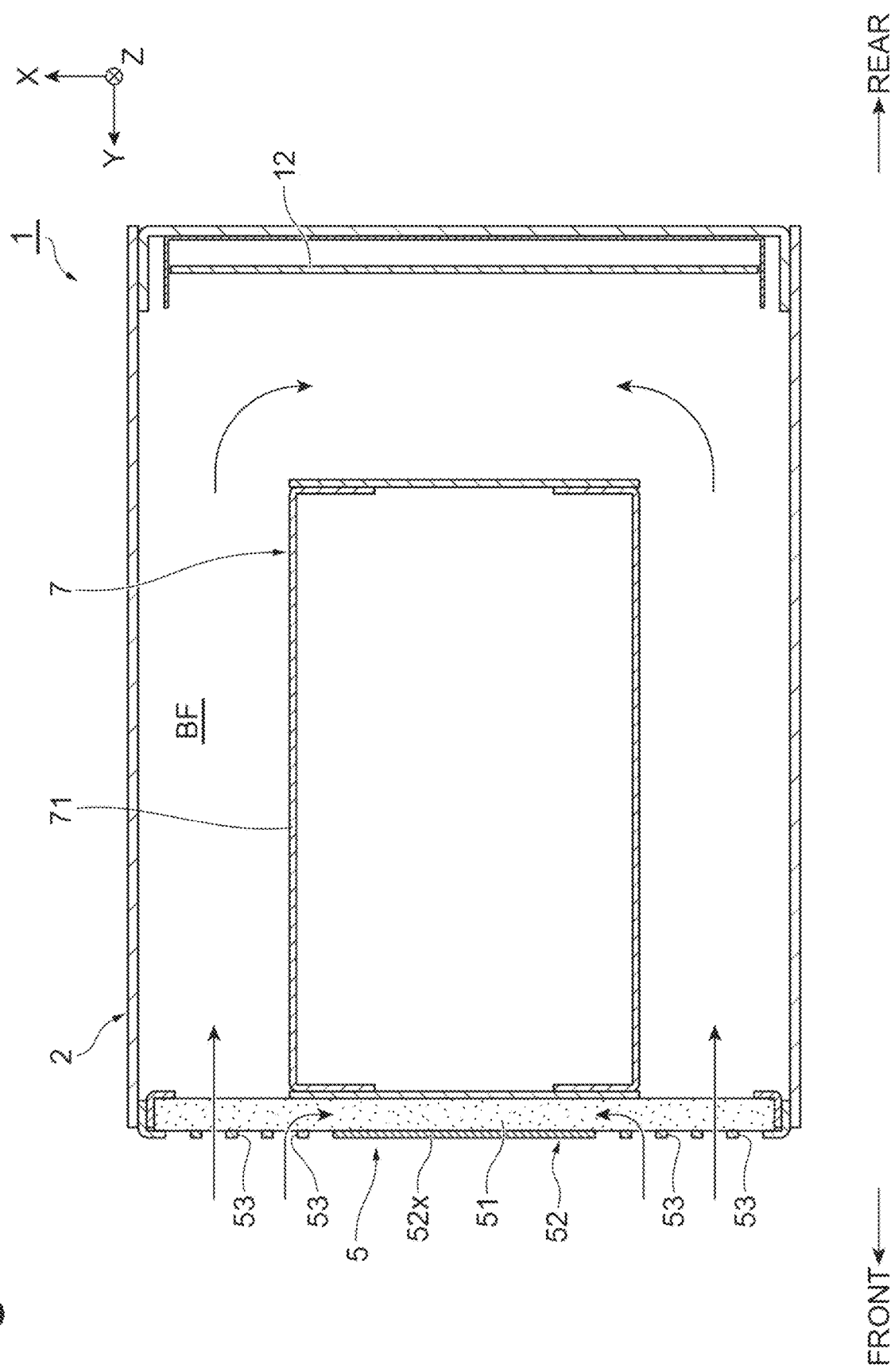
FIG. 8 is an end view of the active energy irradiation device taken along line B-B illustrated in FIG. 7.

As illustrated in FIGS. 6, 7, and 8, in the active energy irradiation device 1, outside air is introduced into the buffer space BF inside the housing 2 by the intake unit 5. The air introduced into the buffer space BF flows downward along the Z direction, and then passes through the heatsink 4 and flows into the duct 7. At this time, in the heatsink 4, the air flows downward along the Z direction between the plurality of heat radiation fins 42 of each of the pair of outer portions 42x, and then flows to pass through between the partition plates 44 and the base plate 41 and to turn upward, and merges at the inner portion 42y. Then, the air flows upward along the Z direction between the plurality of heat radiation fins 42 of the inner portion 42y, and flows into the duct 7.

In addition, the air introduced into the buffer space BF flows downward along the Z direction, and then passes through the driver substrate heatsink 13. The air that has passed through the driver substrate heatsink 13 merges with the flow in the inner portion 42y of the heatsink 4 through a lower rear space inside the housing 2, flows upward along the Z direction between the plurality of heat radiation fins 42 of the inner portion 42y, and flows into the duct 7. The air that has flowed into the duct 7 flows upward along the Z direction, and is discharged to the outside of the housing 2 through the fan 61.

As illustrated in FIG. 7, in the active energy irradiation device 1, the inert gas sprayed from the inert gas supply unit 8 is suctioned by the inert gas suction unit 9, and flows into the housing 2. The inert gas that has flowed into the housing 2 merges with the flow in the inner portion 42y of the heatsink 4 through the lower rear space inside the housing 2, flows upward along the Z direction between the plurality of heat radiation fins 42 of the inner portion 42y, together with the air, and flows into the duct 7. The inert gas that has flowed into the duct 7 flows upward along the Z direction, together with the air, and is discharged to the outside of the housing 2 through the fan 61, together with the air.

In the active energy irradiation device 1 of the present embodiment, as illustrated in FIGS. 9, 10, 11(a), and 11(b), the heat pipe 43 of the heatsink 4 is bent in a U shape and extends when viewed in the X direction. The heat pipe 43 linearly extends in the Z direction when viewed in the Y direction. The heat pipe 43 includes a pair of first heat pipes 48a and 48b provided spaced apart from each other in the X direction, and a pair of second heat pipes 49a and 49b provided spaced apart from each other in the X direction between the pair of first heat pipes 48a and 48b. The second heat pipes 49a and 49b are longer than the first heat pipes 48a and 48b.

Figure 5:
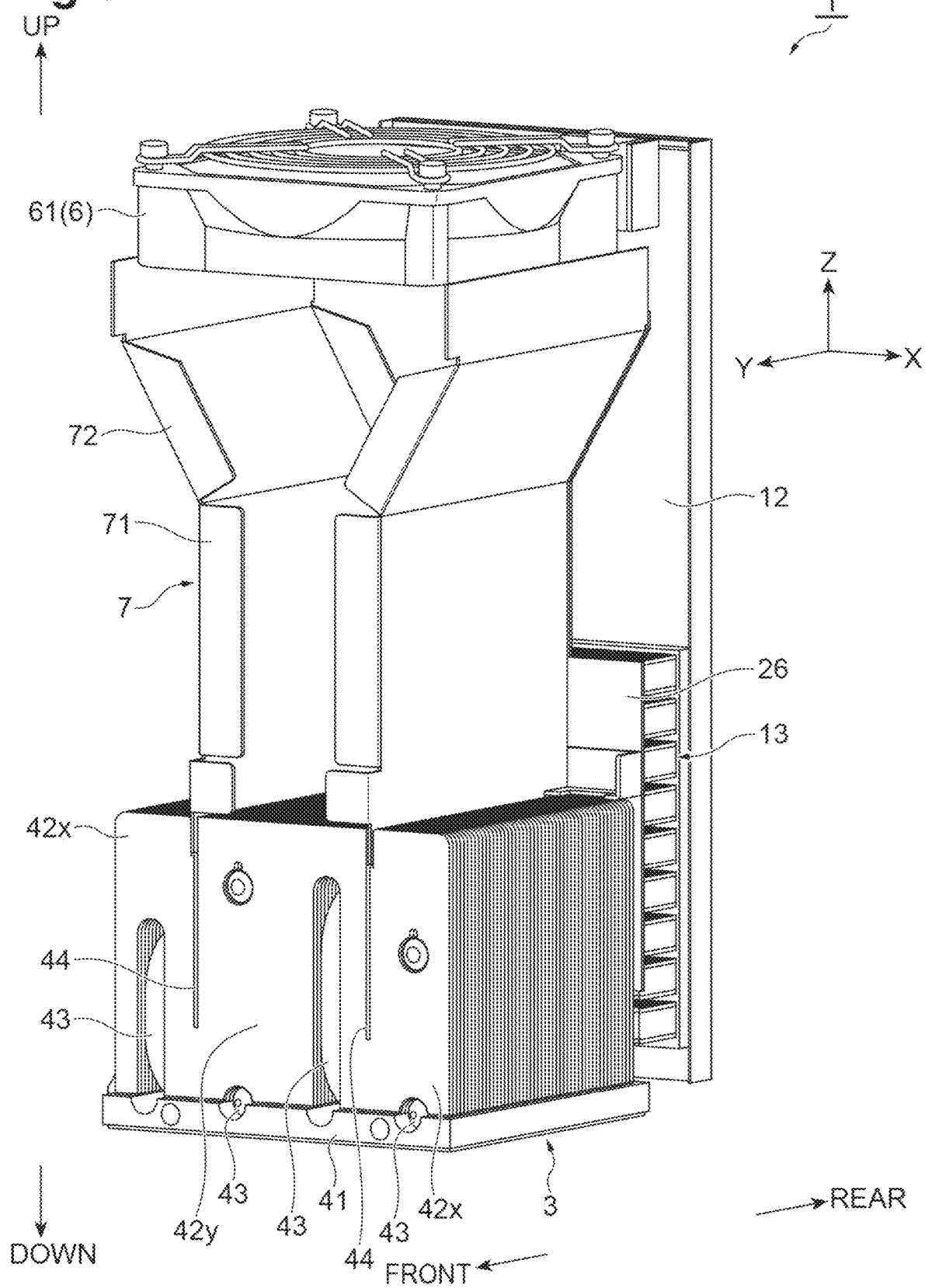
FIG. 5 is a perspective view illustrating an internal configuration of a housing in the active energy irradiation device illustrated in FIG. 2.
Figure 9:
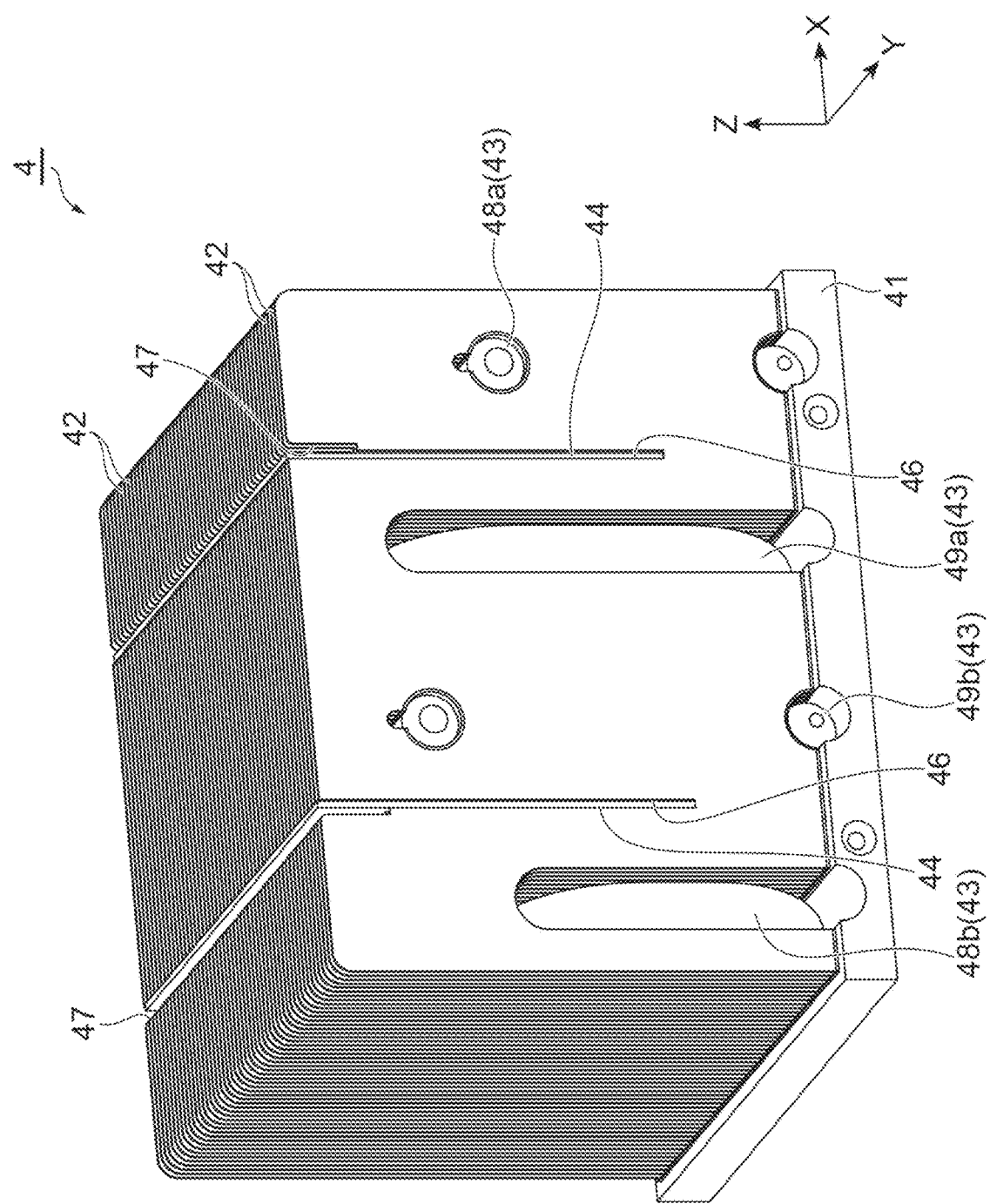
FIG. 9 is a perspective view of a heatsink illustrated in FIG. 4.
Figure 10:
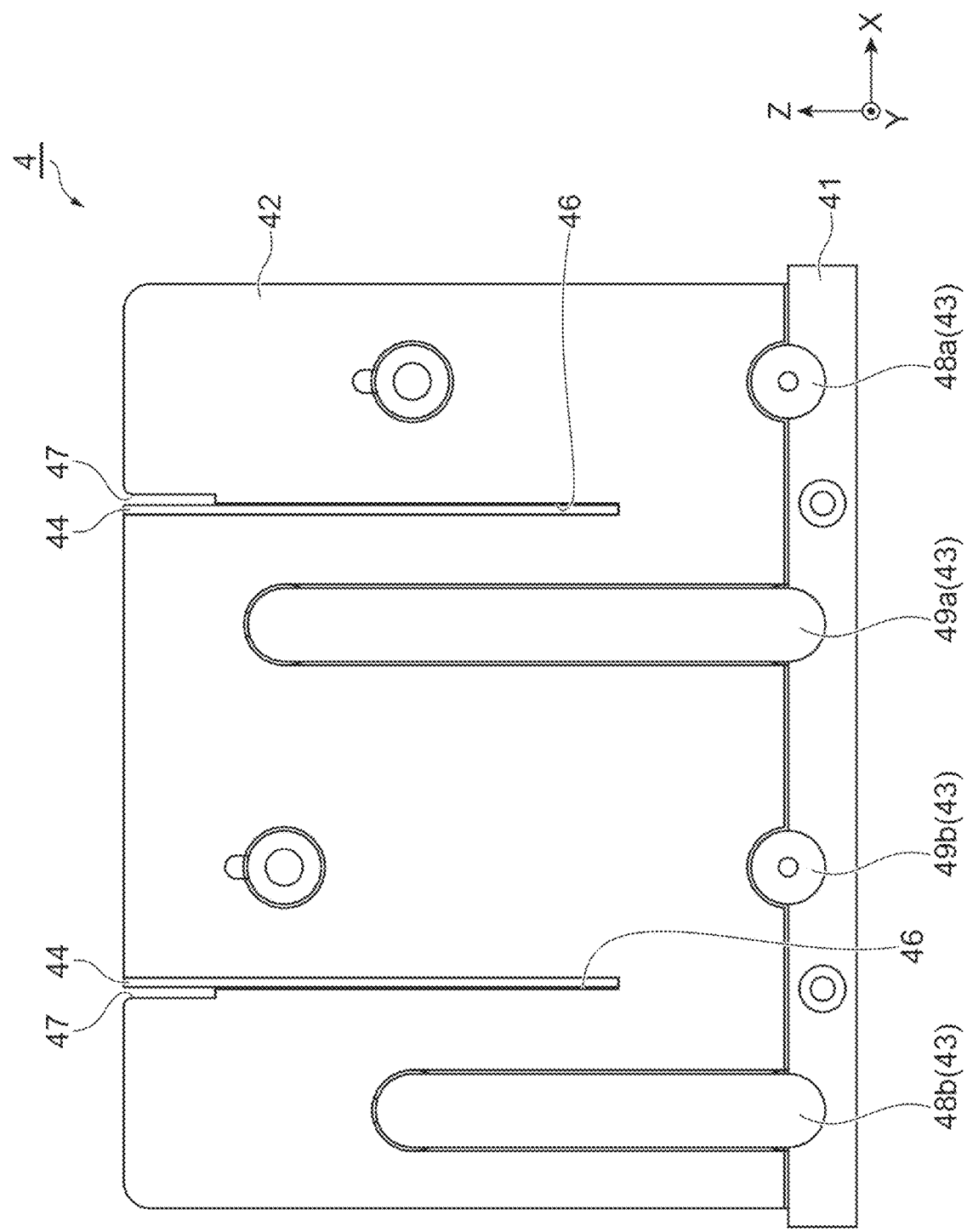
FIG. 10 is a front view of the heatsink illustrated in FIG. 4.

As illustrated in FIGS. 5, 9, and 10, the heat pipes 43 adjacent to each other differ by 180° in the direction of the U shape (direction of an opening side of the U shape). Specifically, the first heat pipe 48a and the second heat pipe 49b that are not adjacent to each other linearly extend rearward along the Y direction so as to be in contact with the base plate 41, and then extend to be bent upward and forward, and linearly extend forward along the Y direction. The first heat pipe 48b and the second heat pipe 49a that are not adjacent to each other linearly extend forward along the Y direction so as to be in contact with the base plate 41, and then extend to be bent upward and rearward, and linearly extend rearward along the Y direction. A linearly extending portion of the heat pipe 43 is brazed and fixed to the plurality of heat radiation fins 42.

The partition plates 44 are provided such that upper end surfaces of the partition plates 44 are located on the same plane as upper end surfaces of the heat radiation fins 42. The partition plates 44 extend such that lower ends of the partition plates 44 are located between the center of the heat radiation fins 42 and the base plate 41 in the Z direction. Namely, as described above, the lower ends of the partition plates 44 are spaced apart from the base plate 41. The partition plates 44 extend to intersect all the heat radiation fins 42 in the Y direction.

The partition plates 44 are interposed in slits 46 formed in the plurality of heat radiation fins 42. The slits 46 are open on the side opposite to the base plate 41 side, and are open in the Y direction. A thickness of the partition plates 44 is less than or equal to a width in the X direction of the slits 46. The slits 46 are each provided between the first heat pipe 48a and the second heat pipe 49a adjacent to each other and between the first heat pipe 48b and the second heat pipe 49b adjacent to each other in the X direction. Namely, the partition plates 44 are each provided between the first heat pipe 48a and the second heat pipe 49a adjacent to each other and between the first heat pipe 48b and the second heat pipe 49b adjacent to each other.

Figure 12:
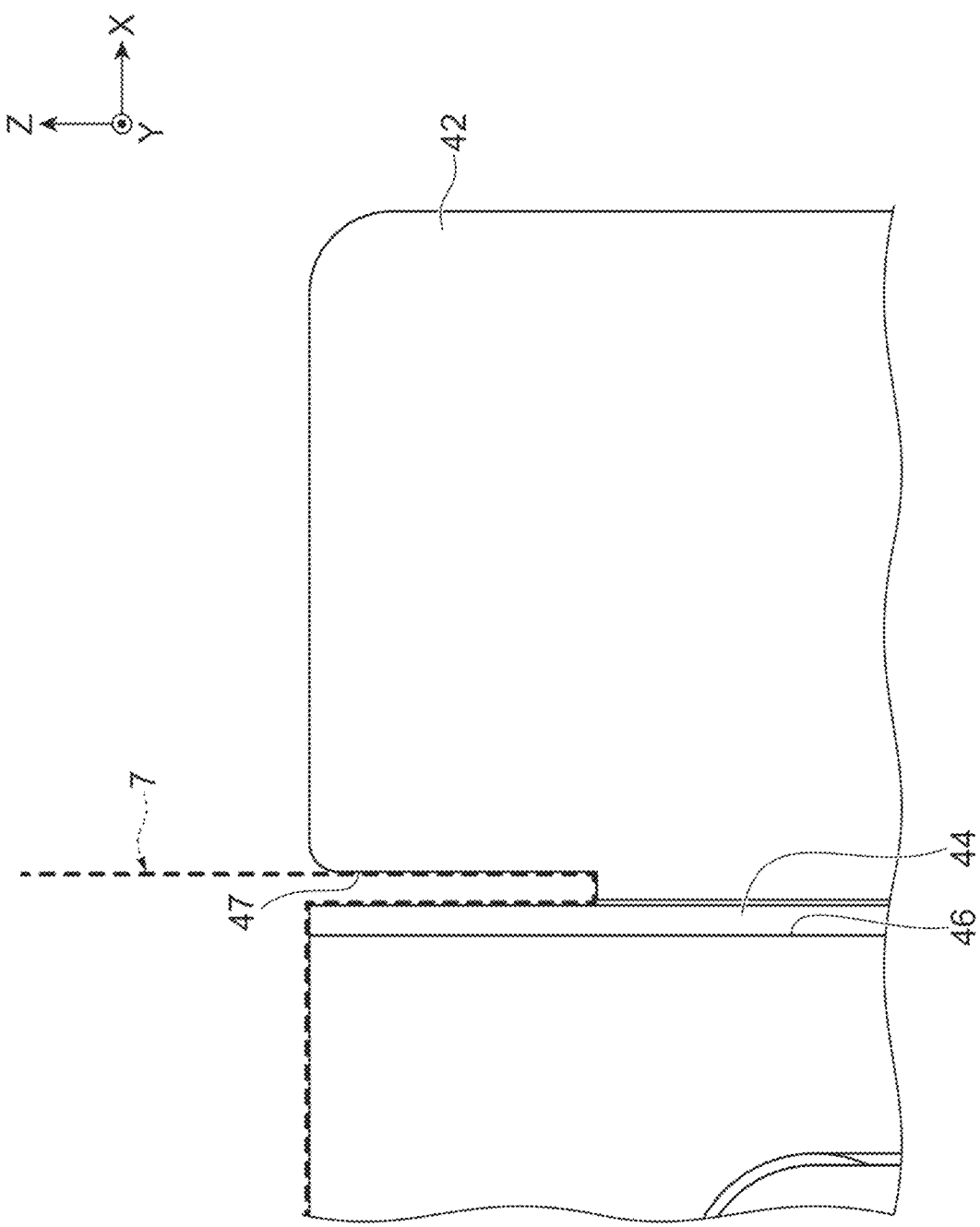
FIG. 12 is a partial enlarged front view of the heatsink illustrated in FIG. 4.

As illustrated in FIGS. 5 and 12, the lower end portions of the duct 7 (end portions on a heatsink 4 side) are inserted into the grooves 47 formed in the heat radiation fins 42 of the heatsink 4. Specifically, at the lower end portions of the duct 7, a pair of side walls facing each other in the X direction (plate-shaped portions with the X direction as a thickness direction) protrude downward. The grooves 47 are open upward and are open in the Y direction. The grooves 47 are provided to continue with the slits 46 at upper end portions of the plurality of heat radiation fins 42.

A thickness of the lower end portion of the duct 7 is less than or equal to a width in the X direction of the groove 47. The lower end portions of the duct 7 are press-fitted into the grooves 47 through a heat conductive grease. Accordingly, the lower end portions of the duct 7 are fixed to the plurality of heat radiation fins (heat conductive material) 42 while being thermally connected thereto, and are in overlapping contact with outer sides in the X direction of the partition plates 44. As a result, the inner portion 42y of the plurality of heat radiation fins 42 partitioned off by the partition plates 44 communicates with the inside of the duct 7 in an airtight manner. The heat conductive grease is not particularly limited, and various greases can be used.

As described above, the buffer space BF illustrated in FIG. 8 is formed inside the housing 2. The buffer space BF forms a flow path allowing the air to flow from the upper side into the gaps between the plurality of heat radiation fins 42 in the pair of outer portions 42x of the heatsink 4.

In the active energy irradiation device 1 of the present embodiment, the buffer space BF and the intake filter 51 of the intake unit 5 are provided around the duct 7 inside the housing 2 so as to surround the duct 7. The air introduced from the intake ports 53 can flow through the inside of the intake filter 51. Air exists inside the intake filter 51 before passing through the heatsink 4. The air that has been introduced from the intake ports 53 and has passed through the intake filter 51 can flow through the buffer space BF. Air exists inside the buffer space BF before passing through the heatsink 4.

The buffer space BF and the intake filter 51 constitute an air presence region. The air presence region is in contact with all outer surfaces (four side surfaces) of the duct 7 having a rectangular pipe shape. In other words, the outer surfaces of the duct 7 are not in direct contact with wall surfaces of the housing 2, and the air presence region is interposed between the outer surfaces of the duct 7 and the wall surfaces of the housing 2. A front side surface of the duct 7 is in contact with the intake filter 51, and three side surfaces other than the front side surface of the duct 7 are in contact with the buffer space BF. The four side surfaces of the duct 7 are surrounded by cooling air as the suctioned air.

As described above, in the active energy irradiation device 1, the duct 7 can be prevented from coming into direct contact with the housing 2 due to the presence of the buffer space BF that is an air presence region and of the intake filter 51 of the intake unit 5. The propagation of heat from the air, which passes through the heatsink 4 and flows through the duct 7, to the housing 2 can be suppressed. Therefore, the overheating of the housing 2 can be suppressed.

In the active energy irradiation device 1, the linear portion 71 and the enlarged portion 72 of the duct 7 have a rectangular pipe shape. All outer surfaces of the linear portion 71 and the enlarged portion 72 of the duct 7 are in contact with the buffer space BF that is an air presence region and with the intake filter 51. In this case, the duct 7 can be reliably prevented from coming into direct contact with the housing 2.

In the active energy irradiation device 1, the air presence region includes the buffer space BF to which the air is introduced by the intake unit 5. In this case, the air presence region can be constituted by the low-temperature buffer space BF to which air is introduced from outside.

In the active energy irradiation device 1, the buffer space BF is defined by the inner surfaces of the housing 2 and the outer surfaces of the linear portion 71 and the enlarged portion 72 of the duct 7. Accordingly, the buffer space BF can be specifically defined.

In the active energy irradiation device 1, the air presence region includes the intake filter 51 of the intake unit 5. In this case, the air presence region can be constituted by the low-temperature intake filter 51 of the intake unit 5.

In the active energy irradiation device 1, the end portions on the heatsink 4 side of the duct 7 are inserted into the grooves 47 formed in the heat radiation fins 42 of the heatsink 4. In this case, the need for a seal member such as a packing at a connection between the duct 7 and the heat radiation fins 42 can be eliminated.

In the active energy irradiation device 1, the intake unit 5 includes the intake ports 53 that are open along the Y direction, and that communicate with the inside of the housing 2. Accordingly, air can be introduced from outside into the housing 2 along a direction intersecting an exhaust direction from the heatsink 4 toward the exhaust unit 6.

In the active energy irradiation device 1, the LED elements 32 perform irradiation with ultraviolet rays. Accordingly, the active energy irradiation device 1 can be used as a device that performs irradiation with ultraviolet rays.

The active energy irradiation system 100 includes the plurality of active energy irradiation devices 1, and the plurality of active energy irradiation devices 1 are arranged to be in contact with each other in the X direction. Since the active energy irradiation system 100 includes the active energy irradiation devices, the effect of suppressing the overheating of the housing 2 is accomplished. In addition, since the plurality of active energy irradiation devices 1 are arranged to be in contact with each other, the housing 2 is likely to become overheated (particularly, both end sides in the X direction are likely to become overheated), so that the effect of suppressing the overheating of the housing 2 becomes particularly effective.

Even when the active energy irradiation devices 1 are connected, the warping of the housings 2 due to heat can be suppressed.

One mode of the present disclosure is not limited to the embodiment.

In the embodiment, the lower ends of the partition plates 44 of the heatsink 4 are spaced apart from the base plate 41; however, the configuration is not limited as long as the configuration allows more air to pass through in the X direction between the plurality of heat radiation fins 42 on the base plate 41 side than on the side opposite to the base plate 41 side, and the configuration may be as follows.

For example, a ventilation portion (for example, a hole, a mesh portion, or the like) allowing the air to pass through may be provided on the base plate 41 side in the partition plate 44. In this case, the ventilation portion can be used as a space through which the air passes. The configuration can be specifically realized in which more air passes through in the X direction between the plurality of heat radiation fins 42 on the base plate 41 side than on the side opposite to the base plate 41 side.

For example, the partition plate 44 may include a mesh portion, and the base plate 41 side of the mesh portion may have a larger opening ratio than that of the side opposite to the base plate 41 in the mesh portion. In this case, the mesh portion can be used as a space through which the air passes, and the base plate 41 side of the mesh portion can be used as a space through which more air passes. The configuration can be specifically realized in which more air passes through in the X direction between the plurality of heat radiation fins 42 on the base plate 41 side than on the side opposite to the base plate 41 side.

In the embodiment, the heatsink 4 includes the partition plates 44, but is not limited to including the partition plates 44, and may include other various partition members as long as the partition members can partition the heatsink 4. In the embodiment, the LED elements 32 as active energy irradiation units perform irradiation with ultraviolet rays; however, the active energy irradiation units may perform irradiation with electron beams. In this case, the active energy irradiation device can be used as a device that performs irradiation with electron beams.

In the embodiment, the heatsink 4 is used to radiate heat from the LED elements 32, and the LED element 32 is a heat-generating unit; however, the heat-generating unit from which the heatsink 4 has to radiate heat is not limited to the LED element 32, and may be other heat-generating units. In the embodiment, the lower end portions of the duct 7 are inserted into the grooves 47 of the heat radiation fins 42 of the heatsink 4; however, the object to be inserted into the grooves 47 is not limited to the duct 7, and may be other members. In this case, the other members can be engaged with the heat radiation fins 42 using the grooves 47.

In the embodiment, the duct 7 has a rectangular pipe shape; however, the shape of the duct 7 is not particularly limited, and may have, for example, other polygonal pipe shapes. In the embodiment, the exhaust unit 6 includes the fan 61; however, the configuration of the exhaust unit 6 is not particularly limited. For example, the exhaust unit 6 may include a pipe for discharging the air and the inert gas to the outdoors, without including the fan 61. In this case, the air and the inert gas may be delivered under pressure by a blower or the like at a connection destination on a downstream side of the pipe.

In the embodiment, the air presence region exists around the linear portion 71 and the enlarged portion 72 of the duct 7; however, the air presence region may exist around only one of the linear portion 71 and the enlarged portion 72, or the air presence region may exist around only a part of the linear portion 71 or a part of the enlarged portion 72.

In the embodiment, the inert gas suction unit 9 is detachably attached to the housing 2 by fasteners such as screws; however, the configuration for detachable attachment is not particularly limited, and a known configuration can be used. For example, the inert gas suction unit 9 may be detachably attached to the housing 2 by sliding the inert gas suction unit 9 with respect to the housing 2.

In the embodiment, the active energy irradiation system 100 includes the plurality of active energy irradiation devices 1 arranged in one row in the X direction, but is not limited thereto. The number and disposition of the active energy irradiation devices according to one mode of the present disclosure is not particularly limited, may be changed as appropriate depending on the system specifications or the like, and, for example, may be configured as in an active energy irradiation system 100Z illustrated in FIG. 13. The active energy irradiation system 100Z includes a pair of units each including a plurality of active energy irradiation devices 1Z fixed to the fixing plate 11 and arranged to be in contact with each other in the X direction. In the example illustrated in FIG. 13, the active energy irradiation devices 1Z are arranged in the Y direction such that back surfaces (rear surfaces) of the active energy irradiation devices 1Z are in contact with each other. The active energy irradiation device 1Z has the same configuration as the active energy irradiation device 1 (refer to FIG. 2) except that the inert gas supply unit 8 is not provided. Incidentally, as illustrated in FIGS. 1 and 13, the plurality of active energy irradiation devices 1 and 1Z can be in contact (connection) with a cooling surface of the housing 2 (wall surface of the housing 2 which is adjacent to a region where air exists before passing through the heatsink 4 inside the housing 2).

Various materials and shapes can be applied to each configuration in the embodiment and the modification examples described above without being limited to the materials and shapes described above. In addition, each configuration in the embodiment or the modification examples described above can be arbitrarily applied to each configuration in other embodiments or modification examples.

REFERENCE SIGNS LIST 1, 1Z: active energy irradiation device, 2: housing, 4: heatsink, 5: intake unit, 6: exhaust unit, 7: duct, 8: inert gas supply unit, 9: inert gas suction unit, 32: LED element (active energy irradiation unit), 42: heat radiation fin, 47: groove, 51: intake filter (filter unit, air presence region), 53: intake port, 71: linear portion, 72: enlarged portion, 100, 100Z: active energy irradiation system, BF: buffer space (space, air presence region).

The invention claimed is:

1. An active energy irradiation device comprising:
a plurality of active energy irradiation units arranged at least along a predetermined direction;
an air-cooled heatsink thermally connected to the active energy irradiation units;
a driver substrate for driving the active energy irradiation device;
an air-cooled driver substrate heatsink thermally connected to the driver substrate;
a housing that houses the active energy irradiation units, the heatsink, the driver substrate and the driver substrate heatsink;
an intake unit that is provided in the housing, and that introduces air into the housing, wherein the air introduced into the housing is divided, a part of the divided air passes through the heatsink and cools the active energy irradiation units and, in parallel, another part of the divided air passes through the driver substrate heatsink and cools the driver substrate;
an exhaust unit that is provided in the housing, and that discharges the air to an outside of the housing; and
a duct provided between the heatsink and the exhaust unit inside the housing, and allowing the air, which has passed through the heatsink, to flow through to the exhaust unit,
wherein an air presence region where the air exists before passing through the heatsink is provided around at least a part of the duct inside the housing so as to surround the duct.

2. The active energy irradiation device according to claim 1,
wherein at least the part of the duct has a polygonal pipe shape, and
all outer surfaces of at least the part of the duct are in contact with the air presence region.

3. The active energy irradiation device according to claim 1,
wherein the air presence region includes a space defined by inner surfaces of the housing and outer surfaces of the duct, and
the intake unit introduces the air into the space.

4. The active energy irradiation device according to claim 3,
wherein the duct includes a linear portion extending with a constant cross-sectional area, and an enlarged portion provided on a downstream side of the linear portion and extending such that a cross-sectional area increases as the enlarged portion extends downstream, and
the space into which the air is introduced by the intake unit is defined by the inner surfaces of the housing, outer surfaces of the linear portion, and outer surfaces of the enlarged portion.

5. The active energy irradiation device according to claim 1, wherein the air presence region includes a filter unit of the intake unit.

6. The active energy irradiation device according to claim 1, wherein an end portion on a heatsink side of the duct is inserted into grooves formed in heat radiation fins of the heatsink.

7. The active energy irradiation device according to claim 1, wherein the intake unit includes an intake port that is open along a direction intersecting a direction from the heatsink toward the exhaust unit, and that communicates with an inside of the housing.

8. The active energy irradiation device according to claim 1, wherein the active energy irradiation units perform irradiation with an ultraviolet ray or an electron beam.

9. An active energy irradiation system comprising:
a plurality of the active energy irradiation devices according to claim 1,
wherein the plurality of active energy irradiation devices are arranged to be in contact with each other in the predetermined direction.

10. An active energy irradiation device comprising:
a plurality of active energy irradiation units arranged at least along a predetermined direction;
an air-cooled heatsink thermally connected to the active energy irradiation units;
a housing that houses the active energy irradiation units and the heatsink;
an intake unit that is provided in the housing, and that introduces air into the housing;
an exhaust unit that is provided in the housing, and that discharges the air to an outside of the housing; and
a duct provided between the heatsink and the exhaust unit inside the housing, and allowing the air, which has passed through the heatsink, to flow through to the exhaust unit,
wherein an air presence region where the air exists before passing through the heatsink is provided around at least a part of the duct inside the housing so as to surround the duct, and wherein an end portion on a heatsink side of the duct is inserted into grooves formed in heat radiation fins of the heatsink.

* * * * *